United States Patent
Cui et al.

(10) Patent No.: US 12,389,165 B2
(45) Date of Patent: Aug. 12, 2025

(54) SOUND GENERATING PANEL AND METHOD FOR MANUFACTURING THE SAME, DISPLAY DEVICE WITH SCREEN GENERATING SOUND

(71) Applicant: BOE Technology Group Co., Ltd., Beijing (CN)

(72) Inventors: Zhao Cui, Beijing (CN); Feng Zhang, Beijing (CN); Wenqu Liu, Beijing (CN); Zhijun Lv, Beijing (CN); Liwen Dong, Beijing (CN); Detian Meng, Beijing (CN); Libo Wang, Beijing (CN); Dongfei Hou, Beijing (CN); Haitao Huang, Beijing (CN); Liuqing Li, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/913,510

(22) PCT Filed: Sep. 13, 2021

(86) PCT No.: PCT/CN2021/117981
§ 371 (c)(1),
(2) Date: Sep. 22, 2022

(87) PCT Pub. No.: WO2023/035265
PCT Pub. Date: Mar. 16, 2023

(65) Prior Publication Data
US 2024/0214744 A1   Jun. 27, 2024

(51) Int. Cl.
*H04R 17/00*   (2006.01)
*H10N 30/081*   (2023.01)
(Continued)

(52) U.S. Cl.
CPC ........... *H04R 17/00* (2013.01); *H10N 30/081* (2023.02); *H10N 30/852* (2023.02); *H10N 30/883* (2023.02); *H04R 2499/15* (2013.01)

(58) Field of Classification Search
CPC ...... H04R 17/00; H04R 2499/15; H04R 3/12; H04R 1/403; H04R 1/24; H10N 30/081;
(Continued)

(56) References Cited

U.S. PATENT DOCUMENTS

| | | | |
|---|---|---|---|
| 2005/0051819 A1* | 3/2005 | Moon | ..................... H01L 28/57 257/295 |
| 2006/0033677 A1* | 2/2006 | Faase | ..................... G02B 26/02 345/30 |

(Continued)

FOREIGN PATENT DOCUMENTS

| | | |
|---|---|---|
| CN | 102082987 A | 6/2011 |
| CN | 202310091 U | 7/2012 |

(Continued)

*Primary Examiner* — Carolyn R Edwards
*Assistant Examiner* — Julie X Dang
(74) *Attorney, Agent, or Firm* — Nath, Goldberg & Meyer; Joshua B. Goldberg

(57) ABSTRACT

A sound generating panel, a display device with a screen generating sound and a method for manufacturing a sound generating panel are provided. The sound generating panel includes sound generating unit groups, each of which includes sound generating units. Each sound generating unit includes a support layer with openings and two piezoelectric structures resonating through a cavity, improving a sound pressure generated by the sound generating panel. Each sound generating unit group includes sound generating units with different radii, thereby realizing sound generating at different frequencies, and improving a sound effect of the sound generating panel. Each of some sound generating unit groups includes ultrasonic detection units for detecting a distance between a listener and the sound generating panel, (Continued)

so that an effect of automatically regulating and controlling a volume of sound is realized. In the display device, the sound generating panel is on a display side of a display panel, so that sound waves can directly enter human ears. The sound generating panel provided by the present disclosure is capable of automatically regulating and controlling the volume of sound and having a vivid sound effect, and the sound generating panel is integrated to the display panel, improving a level of integration of a screen.

17 Claims, 13 Drawing Sheets

(51) Int. Cl.
  *H10N 30/85* (2023.01)
  *H10N 30/88* (2023.01)
(58) Field of Classification Search
  CPC .. H10N 30/883; H10N 30/852; H10N 30/706; G06F 3/04164; G06F 3/016; G06F 3/04146; G06F 3/0445; G06F 3/0446; G06F 3/0448; A61B 8/4494; B06B 1/0622; B06B 1/0603
  See application file for complete search history.

(56) References Cited

U.S. PATENT DOCUMENTS

| | | | | |
|---|---|---|---|---|
| 2010/0208007 | A1* | 8/2010 | Nihei | H10N 30/06 29/25.35 |
| 2012/0140969 | A1* | 6/2012 | Fujise | H04R 17/00 381/190 |
| 2013/0286179 | A1* | 10/2013 | Markle | G01N 21/6458 348/78 |
| 2018/0088718 | A1* | 3/2018 | Liu | G06F 3/0412 |
| 2018/0097042 | A1* | 4/2018 | Miyamoto | G06F 3/0446 |
| 2020/0404403 | A1* | 12/2020 | Lee | G06F 1/1637 |
| 2021/0304722 | A1* | 9/2021 | Kho | H04R 17/00 |
| 2021/0350098 | A1* | 11/2021 | Zhou | G06F 3/045 |
| 2022/0203685 | A1* | 6/2022 | Yamazaki | H10N 30/2047 |
| 2022/0345811 | A1* | 10/2022 | Lin | H04R 1/26 |

FOREIGN PATENT DOCUMENTS

| | | | | |
|---|---|---|---|---|
| CN | 107371097 A | | 11/2017 | |
| CN | 110221467 A | | 9/2019 | |
| CN | 110267182 A | | 9/2019 | |
| CN | 110351402 A | | 10/2019 | |
| CN | 110493697 A | | 11/2019 | |
| CN | 110875351 A | | 3/2020 | |
| CN | 111491242 A | | 8/2020 | |
| CN | 111711900 A | * | 9/2020 | G09F 9/30 |

* cited by examiner

SOUND GENERATING PANEL AND METHOD FOR MANUFACTURING THE SAME, DISPLAY DEVICE WITH SCREEN GENERATING SOUND

This is a National Phase Application filed under 35 U.S.C. 371 as a national stage of PCT/CN2021/117981, filed on Sep. 13, 2021, the content of which is hereby incorporated by reference in its entirety.

TECHNICAL FIELD

The present disclosure relates to a sound generating panel, a method for manufacturing a sound generating panel, and a display device with a screen generating sound, and more particularly, to a sound generating panel including two layers of piezoelectric structures, and a display device including the sound generating panel.

BACKGROUND

A speaker, as an important component of a display product, directly affects an experience effect for a user. A display screen and a speaker of a conventional display product are independent from each other, and the speaker is assembled in the display product through a module process. In a mobile phone product, a speaker is generally positioned at a specific position at a top of a display screen, which runs counter to a development trend of a high screen-to-body ratio of the mobile phone product, and increases a thickness of the mobile phone product. In a TV product, a speaker is mounted under a screen, which results in a poor experience of sound for the user.

The above information disclosed in the background is only for understanding a background of a concept of the present disclosure, and therefore may contain information that does not constitute the prior art.

SUMMARY

In a display device with a screen generating sound according to an example embodiment of the present disclosure, without affecting a screen-to-body ratio of the display device, the sound at full frequency may be generated, thereby improving a sound pressure of the sound generated, and positional information of a user may be collected by using ultrasonic waves, so as to regulate and control a magnitude of volume, thereby improving user's experiences, and providing an immersive tone quality effect.

At least one embodiment of the present disclosure provides a sound generating panel, including at least one sound generating unit group. Each sound generating unit group includes at least one sound generating unit. Each sound generating unit includes a support layer, a first piezoelectric structure and a second piezoelectric structure, the support layer includes a plurality of openings penetrating through the support layer, and the first piezoelectric structure and the second piezoelectric structure are respectively located on two sides of the support layer and cover the opening, corresponding to the first piezoelectric structure and the second piezoelectric structure, in the support layer. The first piezoelectric structure includes a first electrode positioned on the support layer, a first piezoelectric material layer on a side of the first electrode away from the support layer, and a second electrode on a side of the first piezoelectric material layer away from the first electrode. The second piezoelectric structure includes a third electrode on a side of the support layer away from the first piezoelectric structure, a second piezoelectric material layer on a side of the third electrode away from the support layer and a fourth electrode on a side of the second piezoelectric material layer away from the third electrode. Each sound generating unit in the sound generating panel includes two piezoelectric structures, which improves the sound pressure and the user's experiences.

For example, according to an embodiment of the present disclosure, the sound generating panel further includes an encapsulation layer including a first encapsulation layer on a side of the second electrode away from the first piezoelectric material layer and a second encapsulation layer on a side of the fourth electrode away from the second piezoelectric material layer.

For example, in the sound generating panel according to an embodiment of the present disclosure, an orthographic projection of the first piezoelectric structure on a plane where the support layer is located overlaps an orthographic projection of the opening, corresponding to the first piezoelectric structure, on the plane, and/or an orthographic projection of the second piezoelectric structure on the plane where the support layer is located overlaps the orthographic projection of the opening, corresponding to the second piezoelectric structure, on the plane.

For example, according to an embodiment of the present disclosure, the sound generating panel further includes a first insulating layer between the second electrode and the first piezoelectric material layer, and a second insulating layer between the fourth electrode and the second piezoelectric material layer.

For example, in the sound generating panel according to an embodiment of the present disclosure, each sound generating unit is configured to emit sound waves having a frequency ranging from 20 Hz to 20000 Hz.

For example, in the sound generating panel according to an embodiment of the present disclosure, each sound generating unit group includes at least one first sound generating unit for emitting sound waves with a first frequency and at least one second sound generating unit for emitting sound waves with a second frequency.

For example, in the sound generating panel according to an embodiment of the present disclosure, each of the at least one sound generating unit group further includes at least one third sound generating unit configured to emit sound waves having a third frequency, and the first frequency is in a range from 20 Hz to 500 Hz, the second frequency is in a range from 500 Hz to 2000 Hz, and the third frequency is in a range from 2000 Hz to 20000 Hz.

For example, in the sound generating panel according to an embodiment of the present disclosure, sound generating units, emitting sound waves with a same frequency, in each sound generating unit group are arranged along a first direction, and sound generating units, emitting sound waves with different frequencies, are arranged along a second direction; the first direction and the second direction intersect with each other.

For example, in the sound generating panel according to an embodiment of the present disclosure, an orthographic projection of each first sound generating unit on the encapsulation layer is greater than an orthographic projection of each second sound generating unit on the encapsulation layer, and the orthographic projection of each second sound generating unit on the encapsulation layer is greater than an orthographic projection of each third sound generating unit on the encapsulation layer.

For example, in the sound generating panel according to an embodiment of the present disclosure, the at least one sound generating unit group includes at least one ultrasonic detection unit configured to transmit sound waves having a frequency of above 20000 Hz; each of the at least one ultrasonic detection unit includes a receiving electrode in the same layer as the second electrode, a transmitting electrode in the same layer as the fourth electrode, a third piezoelectric material layer in the same layer and made of the same material as the first piezoelectric material layer, a fourth piezoelectric material layer in the same layer and made of the same material as the second piezoelectric material layer, and an ultrasonic support layer in the same layer as the support layer.

For example, according to an embodiment of the present disclosure, the sound generating panel further includes a third insulating layer between the third piezoelectric material layer and the receiving electrode, and a fourth insulating layer between the fourth piezoelectric material layer and the transmitting electrode.

For example, in the sound generating panel according to an embodiment of the present disclosure, an orthographic projection of each ultrasonic detection unit on the plane where the support layer is located is smaller than an orthographic projection of each third sound generating unit on the encapsulation layer.

For example, according to an embodiment of the present disclosure, the sound generating panel further includes a first adhesive layer located between the support layer and the first electrode, and a second adhesive layer located between the support layer and the third electrode, and materials of the first adhesive layer and the second adhesive layer include an optically clear adhesive.

For example, according to an embodiment of the present disclosure, the sound generating panel further includes a first flexible layer located between the first adhesive layer and the first electrode, and a second flexible layer located between the second adhesive layer and the third electrode, and materials of the first flexible layer and the second flexible layer include a polyimide resin.

For example, in the sound generating panel according to an embodiment of the present disclosure, a material of the support layer includes polyethylene terephthalate.

For example, in the sound generating panel according to an embodiment of the present disclosure, a material of the encapsulation layer includes polyimide resin.

For example, in the sound generating panel according to an embodiment of the present disclosure, materials of the first insulating layer and the second insulating layer include silicon nitride.

For example, in the sound generating panel according to an embodiment of the present disclosure, the third insulating layer and the fourth insulating layer are made of silicon nitride.

For example, in the sound generating panel according to an embodiment of the present disclosure, the first piezoelectric material layer, the second piezoelectric material layer, the third piezoelectric material layer and the fourth piezoelectric material layer are made of one or more of polyvinylidene fluoride or poly (vinylidene fluoride-co-trifluoroethylene).

For example, in the sound generating panel according to an embodiment of the present disclosure, the first piezoelectric material layer, the second piezoelectric material layer, the third piezoelectric material layer and the fourth piezoelectric material layer are all made of polyvinylidene fluoride.

For example, in the sound generating panel according to an embodiment of the present disclosure, the first electrode, the second electrode, the third electrode, the fourth electrode, the transmitting electrode, and the receiving electrode are all made of a transparent electrode material.

At least one embodiment of the present disclosure provides a display device with a screen generating sound, and the display device includes the sound generating panel described in any one of the above embodiments and a display panel.

For example, in the display device according to an embodiment of the present disclosure, the display panel includes a display region and a peripheral region, a plurality of pixel units in an array are arranged in the display region; an orthographic projection of each sound generating unit group on the display panel covers at least one pixel unit.

For example, in the display device according to an embodiment of the present disclosure, the sound generating panel is on a light outgoing side of the display panel, the sound generating panel is connected to the display panel through a connection layer, and the connection layer is made of an optically clear adhesive.

For example, in the display device according to an embodiment of the present disclosure, an orthographic projection of each ultrasonic detection unit on the display panel partially overlaps the peripheral region.

For example, in the display device according to an embodiment of the present disclosure, an orthographic projection of each ultrasonic detection unit on the display panel covers at least one pixel unit.

At least one embodiment of the present disclosure provides a method for manufacturing a sound generating panel, including: forming a first encapsulation layer and a first piezoelectric structure, including: forming a first encapsulation layer on a first glass substrate, and forming a second electrode and a transmitting electrode patterned on a side of the first encapsulation layer away from the glass substrate; forming a first insulating layer and a third insulating layer on sides of the second electrode and the transmitting electrode away from the first encapsulation layer, respectively, where the first insulating layer and the third insulating layer are arranged in a same layer and are made of a same material; forming a first piezoelectric material layer and a third piezoelectric material layer on sides of the first insulating layer and the third insulating layer away from the first encapsulation layer, where the first piezoelectric material layer and the third piezoelectric material layer are arranged in a same layer and are made of a same material; forming a first electrode layer on a side of the first piezoelectric material layer away from the first encapsulation layer; peeling off the first glass substrate by using a laser lift-off method; forming a second encapsulation layer and a second piezoelectric structure, including: forming a second encapsulation layer on a second glass substrate, and forming a fourth electrode and a receiving electrode patterned on a side of the second encapsulation layer away from the glass substrate; forming a second insulating layer and a fourth insulating layer on sides of the fourth electrode and the receiving electrode away from the second encapsulation layer, respectively, where the second insulating layer and the fourth insulating layer are arranged in a same layer and made of a same material; forming a second piezoelectric material layer and a fourth piezoelectric material layer on sides of the second insulating layer and the fourth insulating layer away from the second encapsulation layer, where the second piezoelectric material layer and the fourth piezoelectric material layer are arranged in a same material layer and made of a same material; forming a third electrode layer on a side of the second piezoelectric material layer away from the second encapsulation layer; and peeling off the second glass substrate by using the laser lift-off method.

For example, according to an embodiment of the present disclosure, the method includes: forming a plurality of openings arranged in an array in a support layer, and forming a first adhesive layer and a second adhesive layer on opposite sides of the support layer, where the first adhesive layer is configured to adhere the first piezoelectric structure to the support layer, and the second adhesive layer is configured to adhere the second piezoelectric structure to the support layer.

The present disclosure may achieve the following beneficial technical effects.

In a first aspect, all the materials used by the sound generating panel are transparent, and thus when the sound generating panel is arranged on the light outgoing side of the display panel, on one hand, the normal display effect cannot be influenced, on the other hand, the vibration of the piezoelectric material layer can be directly transmitted into the air to cause the vibration of the air, so that the sound waves are transmitted to audiences, and in the process of transmitting the sound waves, the energy loss is minimum, and the distortion of the sound waves is minimum.

In a second aspect, each sound generating unit of the sound generating panel adopts a special sound generating structure with two piezoelectric structures sharing one opening, and in this way, compared with the existing "sandwich" piezoelectric structure, under a same excitation voltage, the vibration amplitude and the vibration energy of the structure are greater, so that the sound pressure is greater.

In a third aspect, the sound generating panel may also utilize the function of measuring a space distance by using ultrasonic waves, that is, the characteristic of the ultrasonic detection unit not only transmitting but also receiving ultrasonic waves, an when the sound generating panel operates, a distance from a listener to the sound generating panel is firstly determined, and then sound with a desired volume is emitted according to the distance.

In a fourth aspect, since a resonance frequency is related to a radius of a vibration element, a magnitude of the resonance frequency is controlled by controlling a magnitude of the radius of the vibration element (i.e., a radius of the sound generating unit), vibration elements with different radii may be provided, so that sound is generated at resonance frequencies in a low frequency range, a medium frequency range and a high frequency range, respectively, the display device generates sound in a full frequency band, and the quality of sound waves is more real and full.

With the present disclosure, the existing display product with a plugin speaker, and the existing product with a screen generating sound by adhering an exciter to the back of the screen so that the screen serves a vibrating diaphragm of a speaker, can be abandoned, and effects of really generating sound by a screen, generating sound by a full-screen, integration of a display function and a sound generating function are realized.

It is to be understood that the above general description and the following detailed description are exemplary and explanatory only and are intended to provide further explanation of the present disclosure as claimed.

BRIEF DESCRIPTION OF DRAWINGS

The above and other features and advantages of the present disclosure will become more apparent by describing in detail exemplary embodiments of the present disclosure with reference to the drawings. Obviously, the drawings in the following description are merely for illustrating some embodiments of the present disclosure. Other drawings may be derived from these drawings by one of ordinary skill in the art without any inventive effort.

DETAIL DESCRIPTION OF EMBODIMENTS

Figure 1:
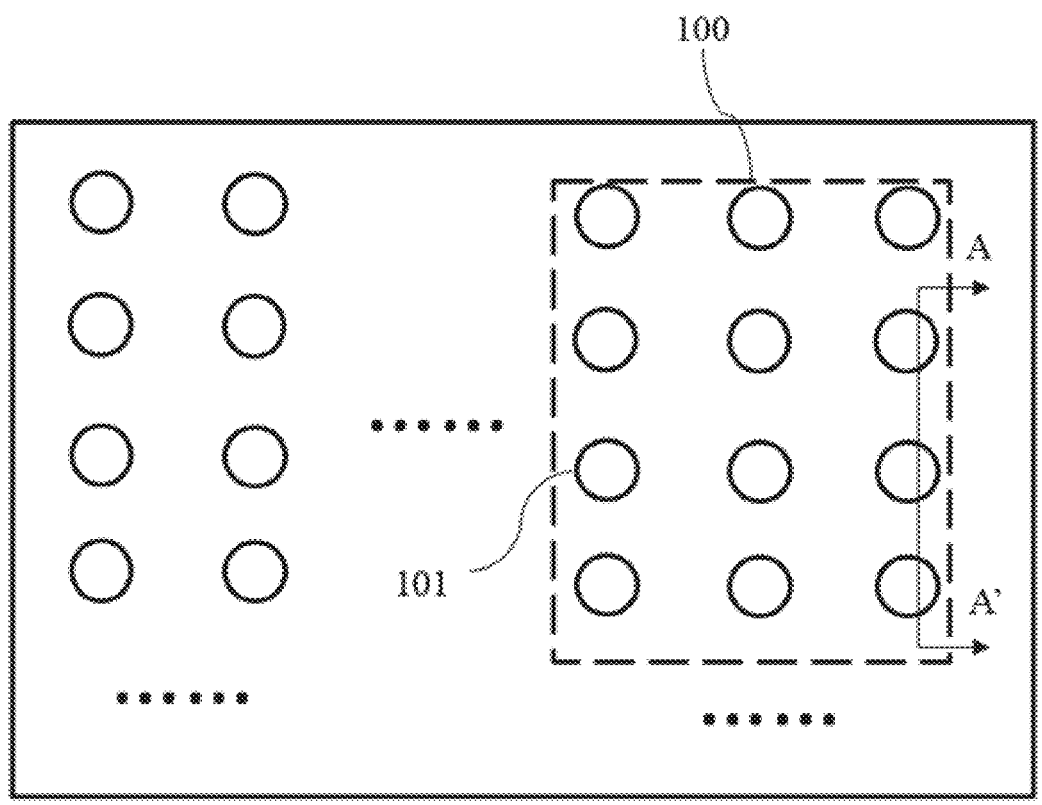
FIG. 1 is a schematic diagram of a sound generating panel according to an embodiment of the present disclosure.

In the following description, for purposes of explanation, numerous specific details are set forth in order to provide a thorough understanding of various exemplary embodiments or implementations of the present disclosure. As used herein, "embodiments" and "implementations" are interchangeable words indicating non-limiting examples of devices or methods that employ one or more of the concepts disclosed herein. It is apparent, however, that the various exemplary embodiments may be practiced without the specific details or with one or more equivalent arrangements. In other instances, well-known structures and devices are shown in block diagrams, in order to avoid unnecessarily obscuring the various exemplary embodiments. Moreover, the various exemplary embodiments may be different, but are not necessarily exclusive. For example, particular shapes, configurations and characteristics in an exemplary embodiment may be used or implemented in another exemplary embodiment without departing from the disclosed concept.

Unless otherwise indicated, the exemplary embodiments shown should be understood as providing exemplary features of varying detail of some implementations in which the concepts of the present disclosure may be implemented in practices. Thus, unless otherwise specified, features, components, modules, layers, films, panels, regions, and/or aspects, etc. (hereinafter referred to individually or collectively as "elements") of the various embodiments may be otherwise combined, separated, interchanged, and/or rearranged without departing from the concepts of the present disclosure.

The use of cross-hatching and/or shading in the drawings is generally provided to clarify a boundary between adjacent elements. Thus, the presence or absence of cross-hatching or shading, unless otherwise stated, does not convey or indicate any preference or requirement for a particular material, a material property, a dimension, a proportion, a commonality among the illustrated elements and/or any other characteristic, attribute, property, etc., of an element. Moreover, in the drawings, a size and a relative size of an element may be exaggerated for clarity and/or description. While example embodiments may be implemented differently, specific processes may be performed in a different order from the described order. For example, two processes described in succession may be performed substantially simultaneously or in a reverse order to the described order. Also, like reference numerals denote like elements.

When an element (such as a layer) is referred to as being "on" another element or layer, "connected to" or "coupled to" the another element or layer, it may be directly on the another element or layer, connected or coupled to the another element or layer, or intervening elements or layers may be present. However, when an element or layer is referred to as being "directly on" another element or layer, "directly connected to" or "directly coupled to" another element or layer, no intervening element or layer exists. To this extent, the term "connected" or "coupled" may indicate a physical, electrical, and/or fluid connection with or without intervening elements. Further, a D1-axis, a D2-axis and a D3-axis are not limited to three axes (such as an x-axis, a y-axis and a z-axis) of a rectangular coordinate system, and may be construed in a broader sense. For example, the D1-axis, the D2-axis and the D3-axis may be perpendicular to each other, or may represent different directions that are not perpendicular to each other. For purposes of the present disclosure, "at least one of X, Y and Z" and "at least one selected from a group consisting of X, Y and Z" may be interpreted as X only, Y only. Z only, or any combination of two or more of X, Y and Z, such as, XYZ, XYY, YZ, and ZZ. As used herein, the term "and/or" includes any and all combinations of one or more of the associated listed items.

Although the terms "first", "second", etc. may be used herein to describe various types of elements, these elements should not be limited by these terms. These terms are used to distinguish one element from another. Thus, a first element discussed below could be termed a second element without departing from the teachings of the present disclosure.

Spatially relative terms such as "beneath", "below", "lower", "above", "upper", "over", "higher", "side" (such as, "in a sidewall"), and the like, may be used herein for descriptive purposes, and therefore, to describe a relationship between two elements as illustrated in the drawings. Spatially relative terms are intended to encompass different orientations of the device in use, operation, and/or process of manufacturing in addition to orientations depicted in the drawings. For example, if the device in the drawings is turned over, elements described as "below" or "beneath" other elements or features would then be oriented "above" the other elements or features. Thus, the exemplary term "below" may encompass both orientations of above and below. Also, the device may be otherwise oriented (e.g., rotated by 90 degrees or at other orientations), and thus the spatially relative descriptors used herein are interpreted accordingly.

Terms used herein are for the purpose of describing particular embodiments and are not intended to be limiting. As used herein, the singular forms "a", "an" and "the" are intended to include the plural forms as well, unless the context clearly indicates otherwise. Furthermore, the terms "comprise", "comprising", "include", and/or "including", when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and similar terms are used as terms of approximation, rather than degree, and thus, are utilized to take into account inherent deviations in measured, calculated, and/or provided values that would be recognized by one of ordinary skill in the art.

Various exemplary embodiments are described herein with reference to cross-sectional and/or exploded views as schematic illustrations of idealized exemplary embodiments and/or intermediate structures. Variations from the shown shapes as a result, for example, of manufacturing techniques and/or tolerances, are to be expected. Thus, the exemplary embodiments disclosed herein should not necessarily be construed as limited to shapes of regions specifically illustrated, but are to include deviations in shapes that result, for example, from manufacturing. In this way, the regions illustrated in the drawings may be schematic in nature and the shapes of these regions may not reflect an actual shape of a region of a device and thus are not necessarily intended to be limiting.

As is conventional in the art, some example embodiments are shown and described in the drawings, in terms of functional blocks, units, and/or modules. One of ordinary skill in the art will appreciate that the blocks, units and/or modules are physically implemented by electronic (or optical) circuits, such as logic circuits, discrete components, microprocessors, hardwired circuits, memory elements, wired connections, etc., which may be formed by using semiconductor-based or other manufacturing techniques. In the case of blocks, units, and/or modules being implemented by a microprocessor or other similar hardware, they may be programmed and controlled by using software (e.g., microcode) to perform the various functions discussed herein, and may be selectively driven by firmware and/or software. It is also contemplated that each block, unit, and/or module may be implemented by dedicated hardware or as a combination of dedicated hardware for performing some functions and a processor (e.g., one or more programmed microprocessors and associated circuits) for performing other functions. Moreover, each block, unit and/or module of some example embodiments may be physically separated into two or more interactive and discrete blocks, units and/or modules without departing from the scope of the disclosed concept. Furthermore, the blocks, units and/or modules of some example embodiments may be physically combined into more complex blocks, units and/or modules without departing from the scope of the disclosed concept.

Unless otherwise defined, all terms (including technical and scientific terms) used herein have the same meanings as commonly understood by one of ordinary skill in the art to which the present disclosure belongs. Unless explicitly defined herein, terms, such as those defined in commonly used dictionaries, should be interpreted as having a meaning that is consistent with their meaning in the context of the relevant art and will not be interpreted in an idealized or overly formal sense.

Figure 2:
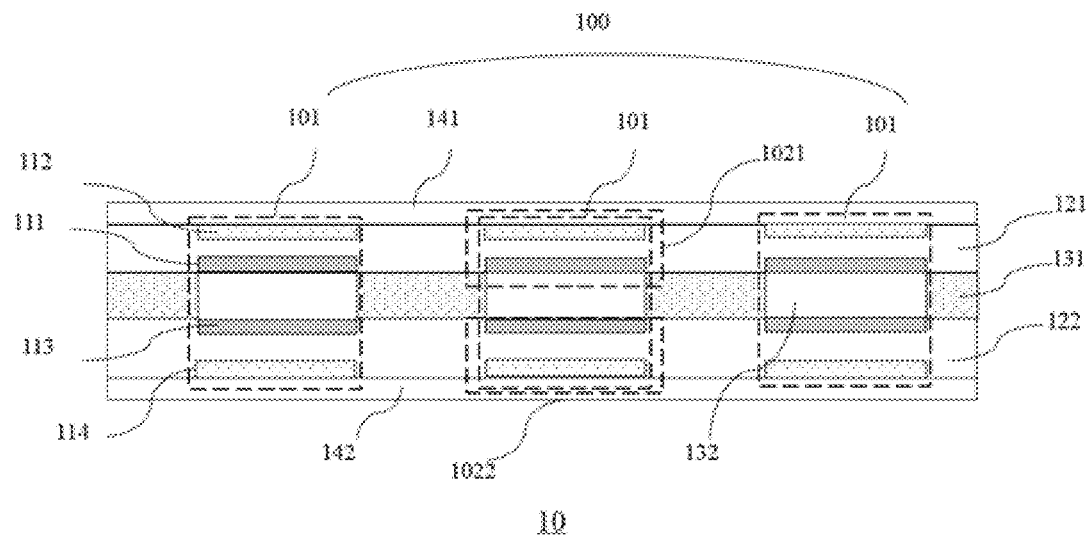
FIG. 2 is a cross-sectional view of a sound generating panel according to an embodiment of the present disclosure.

FIG. 1 is a schematic diagram of a structure of a sound generating panel 10 according to an exemplary embodiment of the present disclosure, and FIG. 2 is a cross-sectional view taken along a line A-A' of FIG. 1. Referring to FIGS. 1 and 2, the sound generating panel 10 includes at least one sound generating unit group 100, and further includes a first encapsulation layer 141 and a second encapsulation layer 142. The sound generating unit group 100 includes at least one sound generating unit 101, and each sound generating unit 101 includes a support layer 131, and a first piezoelectric structure 1021 and a second piezoelectric structure 1022 respectively on two sides of the support layer 131. The first piezoelectric structure 1021 includes a first electrode 111, a second electrode 112, and a first piezoelectric material layer 121 between the first electrode 111 and the second electrode 112; the second piezoelectric structure 1022 includes a third electrode 113, a fourth electrode 114, and a second piezoelectric material layer 122 between the third electrode 113 and the fourth electrode 114. The support layer 131 has a plurality of openings 132 penetrating through the support layer 131. In the present embodiment, on one hand, the first piezoelectric structure and the second piezoelectric structure are located on two sides of the support layer, so that vibrations with a same frequency may be simultaneously realized, thereby improving the sound pressure of the sound generating panel; on the other hand, the openings in the support layer may restrict a vibration of the piezoelectric material layer in a direction perpendicular to a direction in which sound is generated, increase the bending effect of the piezoelectric structure layer, avoid noise and crosstalk, and improve the hearing experience of listeners.

With continued reference to FIGS. 1 and 2, in some embodiments, an orthographic projection of the first piezoelectric structure 1021 on a plane where the support layer 131 is located overlaps an orthographic projection of the opening 132, corresponding to the first piezoelectric structure 1021, on the plane as much as possible, and/or an orthographic projection of the second piezoelectric structure 1022 on the plane where the support layer 131 is located overlaps the orthographic projection of the opening 132, corresponding to the second piezoelectric structure 1022, on the plane. It is verified that, when the orthographic projection of the piezoelectric structure on the plane where the support layer is located is greater than the orthographic projection of the opening, corresponding to the piezoelectric structure, on the plane, an amplitude of vibration of the piezoelectric structure is reduced, so that a sound volume is affected, as known by one of ordinary skill in the art, the sound volume is positively correlated with the sound pressure, and both the sound volume and the sound pressure are physical quantities for reflecting a loudness magnitude; when the orthographic projection of the piezoelectric structure on the plane where the support layer is located is smaller than the orthographic projection of the opening, corresponding to the piezoelectric structure, on the plane, cost and difficulty of processing are increased. In the embodiments, the first piezoelectric structure and the second piezoelectric structure make full use of a space of the opening corresponding thereto, which not only may maximize an amplitude of vibration of the sound generating unit, but also may reduce the cost.

Figure 3:
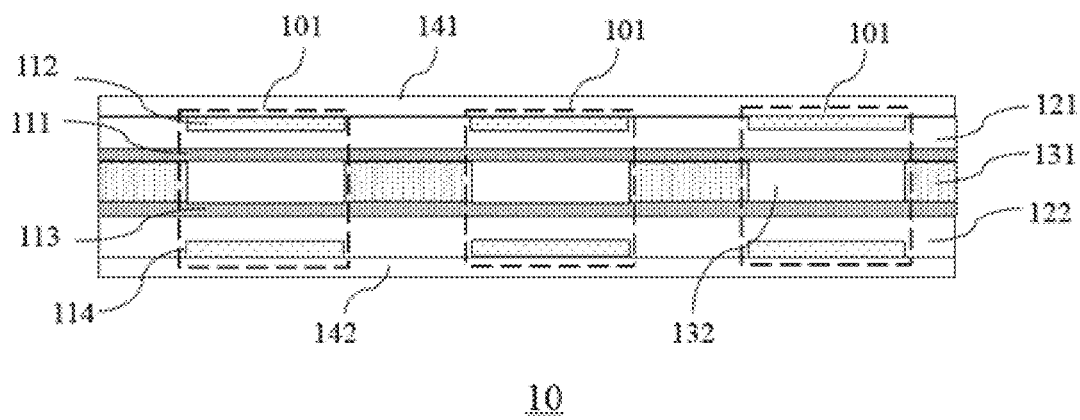
FIG. 3 is a cross-sectional view of another sound generating panel according to an embodiment of the present disclosure.

Referring to FIG. 3, in some embodiments, first electrodes 111 of sound generating units 101 are disposed in a same layer and made of a same material, and/or third electrodes 113 of the sound generating units 101 are disposed in a same layer and made of a same material. The first electrodes 111 formed into one piece and the third electrodes 113 formed into one piece may be connected to different common electrode signals respectively, or may be connected to a same common electrode signal, for example, the first electrodes 111 and the third electrodes 113 are grounded. The first electrodes and the third electrodes being respectively formed into one piece can reduce the number of steps of patterning and the production cost.

Figure 4:
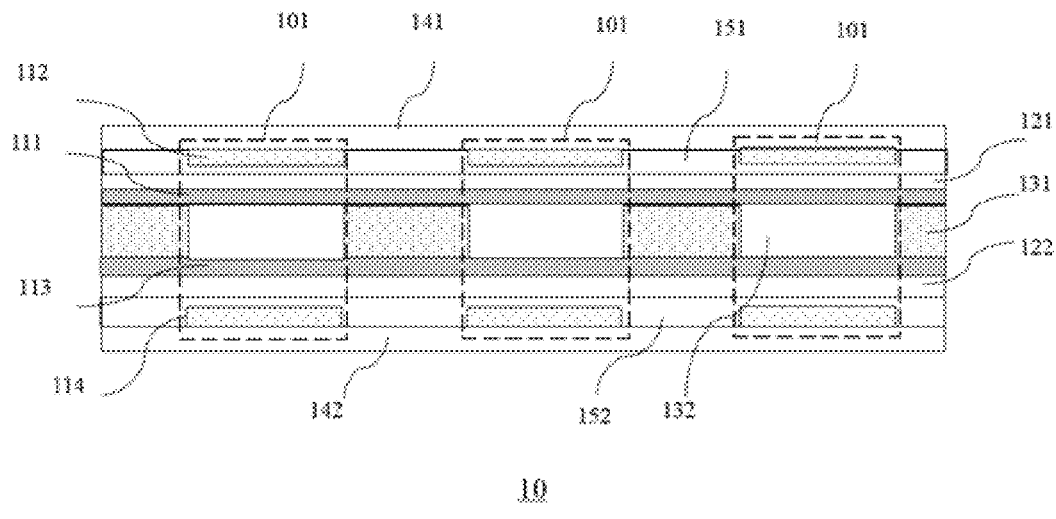
FIG. 4 is a cross-sectional view of another sound generating panel according to an embodiment of the present disclosure.

Referring to FIG. 4, in some embodiments, a first insulating layer 151 is provided between each second electrode 112 and the first piezoelectric material layer 121; a second insulating layer 152 is provided between each fourth electrode 114 and the second piezoelectric material layer 122. By providing such insulating layers, on the one hand, a defect caused by the piezoelectric material layer, before being cured, contacting the electrode may be avoided; on the other hand, with the insulating layers, the piezoelectric material layer may be prevented from being broken down, thereby improving the yield. In some embodiments, the piezoelectric material layer is formed by coating a solution of a corresponding material on the insulating layer and then being cured by evaporating solvent in the solution out. Before being cured, the solvent in the solution may affect the electrode, and thus affect an effect of sound generating.

With continued reference to FIG. 1, in some embodiments, an orthographic projection of each sound generating unit 101 of the sound generating panel 10 on the plane where the support layer is located may be in a shape of a circle, and may also be in a shape of a rectangle, a regular polygon, or the like, which is not limited in the embodiments. In the embodiments, orthographic projections of sound generating units 101 on the plane where the support layer is located have a consistent shape and a consistent radius. For example, a shape of each sound generating unit is a cube with a side length ranging from 0.6 mm to 1 mm, or a circle with a diameter ranging from 0.6 mm to 1 mm, and each sound generating unit is configured to emit sound waves with a frequency in a range from 20 Hz to 20000 Hz.

Figure 5:
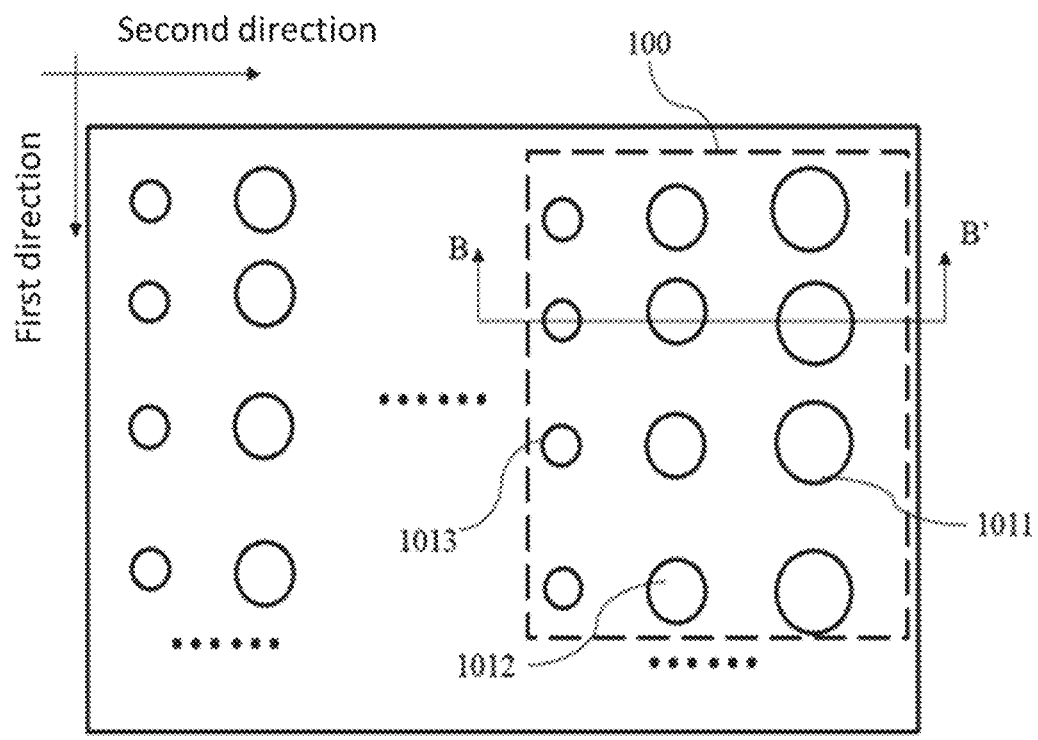
FIG. 5 is a schematic diagram of another sound generating panel according to an embodiment of the present disclosure.
Figure 6:
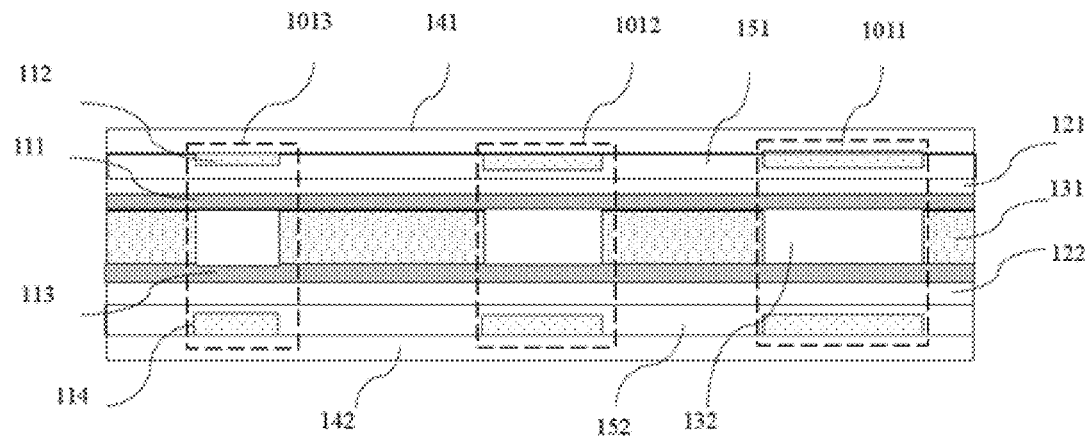
FIG. 6 is a cross-sectional view of another sound generating panel according to an embodiment of the present disclosure.

Referring to FIGS. 5 and 6. FIG. 6 is a cross-sectional view taken along a line B-B' of FIG. 5, each sound generating unit group 100 includes at least one first sound generating unit 1011 for emitting sound waves with a first frequency, at least one second sound generating unit 1012 for emitting sound waves with a second frequency, and at least one third sound generating unit 1013 for emitting sound waves with a third frequency. In some embodiments, each sound generating unit group 100 may further include at least one fourth sound generating unit for emitting sound waves with a fourth frequency, at least one fifth sound generating unit for emitting sound waves with a fifth frequency, and the like, which is not limited herein. The first frequency is in a range from 20 Hz to 500 Hz, the second frequency is in a range from 500 Hz to 2000 Hz, and the third frequency is in a range from 2000 Hz to 20000 Hz. In the embodiments, these three frequencies of sound waves are all distributed in a range being audible for human ears. Compared with a sound generating panel which only emits sound waves with a same frequency, the sound generating panel according to the embodiments of the present disclosure can emit sound waves with a low frequency (in a range from 20 Hz to 500 Hz), a medium frequency (in a range from 500 Hz to 2000 Hz) and/or a high frequency (in a range from 2000 Hz to 20000 Hz), so that a listener can hear more full and vivid sound.

With continued reference to FIGS. 5 and 6, in some embodiments, sound generating units emitting sound waves with a same frequency are arranged along a first direction and sound generating units emitting sound waves with different frequencies are arranged along a second direction. The first direction and the second direction intersect with each other, and in particular, the first direction and the second direction are perpendicular to each other. Such arrangement of the sound generating units may enable sound waves with various frequencies to be distributed uniformly, thereby improving a sense of levels of sound generating.

The formula (1) illustrates a relation between a resonance frequency and a radius of a vibration element, where $f_0$ indicates the resonance frequency, i.e., a sound generating frequency of the sound generating unit; t indicates a resonance point, and a first-order resonance point is adopted in the embodiments, i.e., t=1, r indicates the radius of the vibration element, i.e., a radius of the sound generating unit; ρ indicates a density of an acoustic wave propagation medium; and v indicates a velocity of sound wave in the acoustic wave propagation medium.

$$f_0 = 0.47 \frac{t}{r^2} \sqrt{\frac{\rho v}{\rho(1-v^2)}} \quad (1)$$

It can be seen from the above formula (1) that the radius of the sound generating unit is inversely proportional to the sound generating frequency. With continued reference to FIG. 5 and FIG. 6, the radius of the first sound generating unit 1011 is greater than the radius of the second sound generating unit 1012, and the radius of the second sound generating unit 1012 is greater than the radius of the third sound generating unit 1013.

Figure 7:
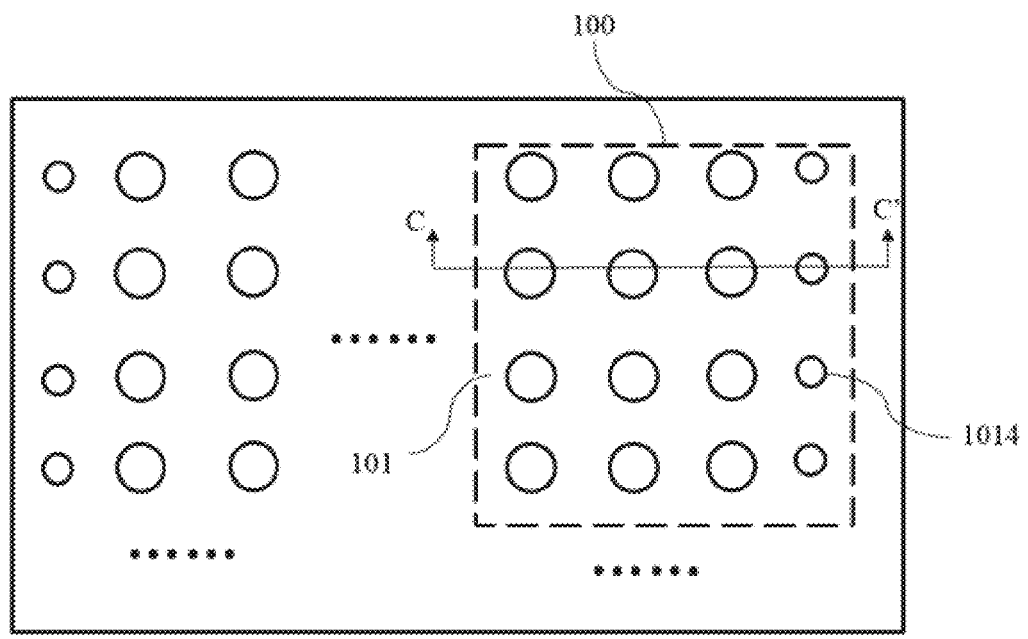
FIG. 7 is a schematic diagram of another sound generating panel according to an embodiment of the present disclosure.

Referring to FIG. 7, in some embodiments, the at least one sound generating unit group 100 in the sound generating panel 10 further includes at least one ultrasonic detection unit 1014 configured to transmit and receive sound waves having a frequency of above 20000 Hz. The at least one ultrasonic detection unit 1014 is used to detect a distance between the listener and the sound generating panel, and the sound generating panel having the ultrasonic detection unit 1014 may adjust the sound pressure of the sound waves according to the distance between the listener and the sound generating panel. In particular, referring to FIG. 7, the at least one ultrasonic detection unit 1014 is located at a side edge or a corner of the sound generating panel. For example, ultrasonic detection units 1014 are respectively provided on a left side edge and a right side edge of the sound generating panel; the ultrasonic detection unit located on the left side edge is used for detecting a distance between the listener and the left side edge of the sound generating panel, the ultrasonic detection unit located on the right side edge is used for detecting a distance between the listener and the right side edge of the sound generating panel. A position of the listener is simultaneously detected by the ultrasonic detection units on such two side edges, and in combination with an algorithm, accurate positioning of the listener is achieved.

Figure 8:
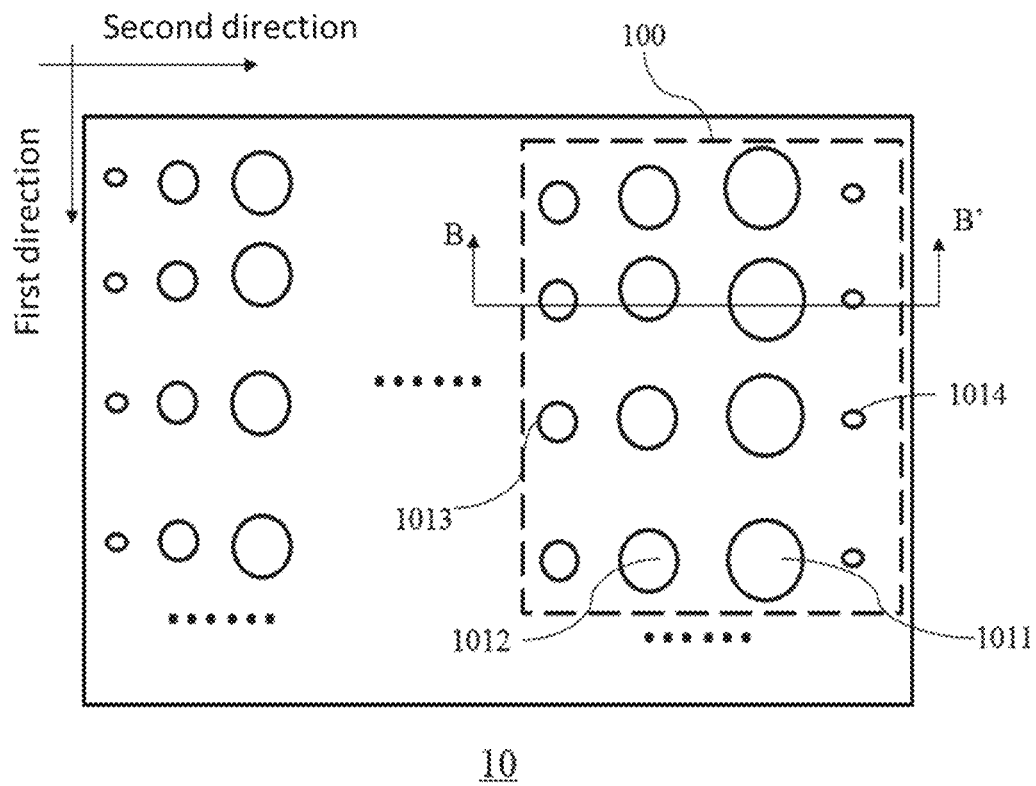
FIG. 8 is a schematic diagram of another sound generating panel according to an embodiment of the present disclosure.

Referring to FIG. 8, in some embodiments, the at least one sound generating unit group 100 in the sound generating panel 10 further includes at least one ultrasonic detection unit 1014 configured to transmit and receive sound waves having a frequency of above 20000 Hz. The at least one ultrasonic detection unit 1014 is used to detect a distance between the listener and the sound generating panel, and the sound pressure of the sound waves is adjusted according to the distance between the listener and the sound generating panel. In particular, referring to FIG. 8, the at least one ultrasonic detection unit 1014 is located at an edge of the display panel. The ultrasonic detection unit located on the left side edge is used for detecting a distance between the listener and the left side edge of the sound generating panel, the ultrasonic detection unit located on the right side edge is used for detecting a distance between the listener and the right side edge of the sound generating panel. With such arrangement, the accurate positioning of the listener is achieved. The sound generating unit of FIG. 7 can only emit sound waves with a same frequency; the sound generating unit of FIG. 8 can emit sound waves with frequencies in three different ranges, for example, with a low frequency, a medium frequency and a high frequency.

Figure 9:
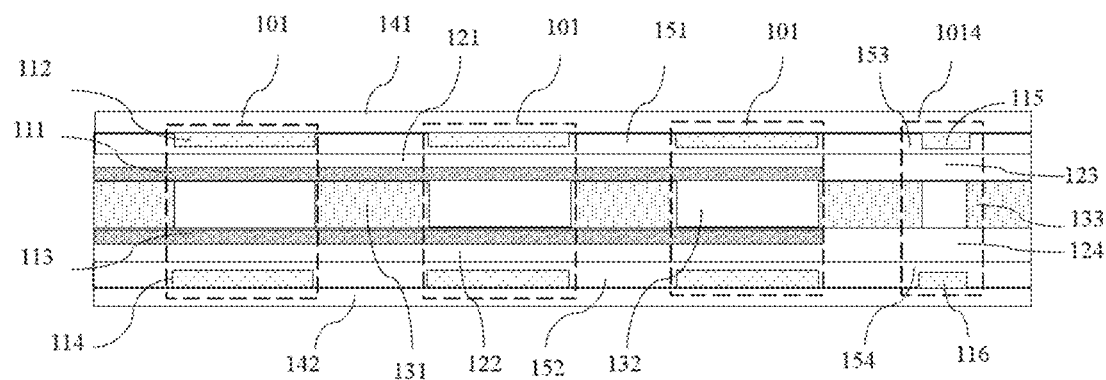
FIG. 9 is a cross-sectional view of another sound generating panel according to an embodiment of the present disclosure.
Figure 10:
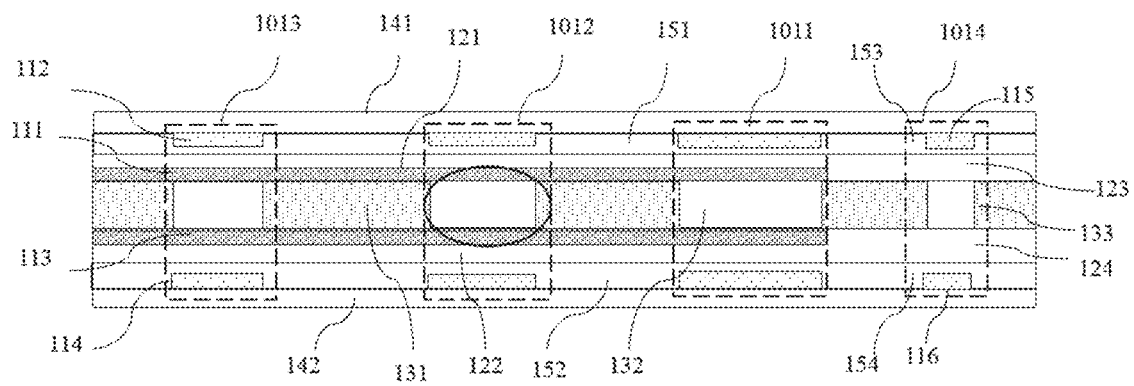
FIG. 10 is a cross-sectional view of another sound generating panel according to an embodiment of the present disclosure.

Referring to FIGS. 9 and 10, FIG. 9 is a cross-sectional view taken along a line C-C' of FIG. 7, and FIG. 10 is a cross-sectional view taken along a line D-D' of FIG. 8, each ultrasonic detection unit 1014 includes a receiving electrode 115 disposed in the same layer as the second electrode 112, and a transmitting electrode 116 disposed in the same layer as the fourth electrode 114. The transmitting electrode 116 is configured to transmit an ultrasonic signal to outside, and the receiving electrode 115 is configured to receive an ultrasonic signal reflected from the outside. Each ultrasonic detection unit further includes a third piezoelectric material layer 123 disposed in the same layer and made of the same material as the first piezoelectric material layer 121, a fourth piezoelectric material layer 124 disposed in the same layer and made of the same material as the second piezoelectric material layer 122, and an ultrasonic support layer 133 disposed in the same layer as the support layer 131. In some embodiments, a thickness of each of the first electrode 111 and the third electrode 113 (about 0.08 μm in the embodiments) is much smaller than a thickness of each of the first piezoelectric material layer 121 and the second piezoelectric material layer 122 (about 9 μm in the embodiments), and referring to FIG. 9, it may be considered that the third piezoelectric material layer 123 and the first piezoelectric material layer 121 are disposed in a same layer and made of a same material; and the fourth piezoelectric material layer 124 and the second piezoelectric material layer 122 are disposed in a same layer and made of a same material. In some embodiments, thicknesses of the third piezoelectric material layer 123 and the first piezoelectric material layer 121 are equal to each other; thicknesses of the fourth piezoelectric material layer 124 and the second piezoelectric material layer 122 are equal to each other. It is verified that such designs of thicknesses may reduce processes and improve the production efficiency.

With continued reference to FIGS. 9 and 10, in some embodiments, each ultrasonic detection unit 1014 further includes a third insulating layer 153 located between the third piezoelectric material layer 123 and the receiving electrode 115, and a fourth insulating layer 154 located between the fourth piezoelectric material layer 124 and the transmitting electrode 116. The third insulating layer 153 and the first insulating layer 151 are disposed in a same layer and made of a same material; and the fourth insulating layer 154 and the second insulating layer 152 are disposed in a same layer and made of a same material.

From the above formula (1), one of ordinary skill in the art should understand that, a radius of each ultrasonic detection unit 1014 is smaller than that of each sound generating unit 101, as shown in FIG. 9; the radius of each ultrasonic detection unit 1014 is smaller than that of each third sound generating unit 1013, as shown in FIG. 10.

Figure 11:
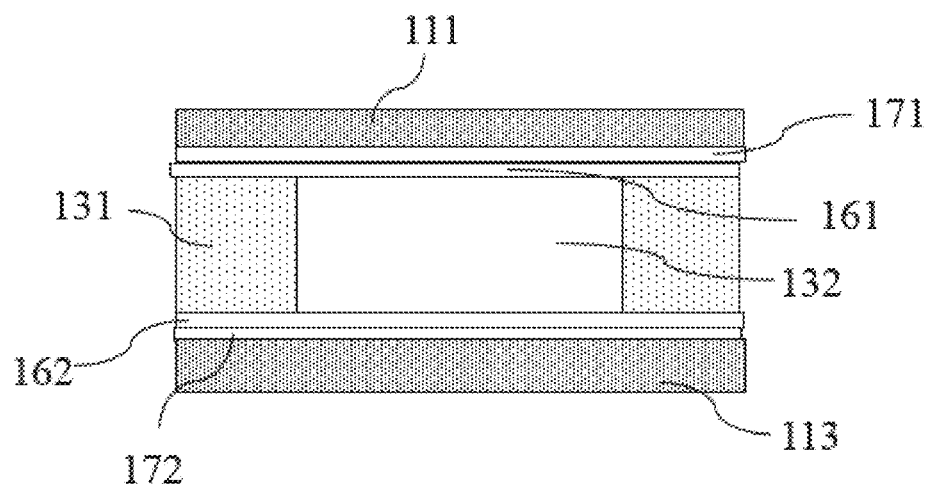
FIG. 11 is a cross-sectional view of a part of another sound generating panel according to an embodiment of the present disclosure.

Referring to FIG. 11, FIG. 11 is a detailed view of a circled portion of FIG. 10. In some embodiments, a first adhesive layer 161 is provided between the support layer 131 and the first electrode 111, and a second adhesive layer 162 is provided between the support layer 131 and the third electrode 112. The first adhesive layer 161 and the second adhesive layer 162 are made of optically clear adhesive (OCA) or optically clear resin (OCR) and are used for bonding the support layer 131 with the first electrode 111, and bonding the support layer 131 with the third electrode 113, respectively. It is verified that the thicker each of the first adhesive layer 161 and the second adhesive layer 162 is, the smaller the sound pressure is, and thus the more blurred the sound heard by the listener is. In some embodiments, a thickness of each of the first adhesive layer 161 and the second adhesive layer 162 ranges from about 10 μm to about 25 μm.

With continued reference to FIG. 11, in some embodiments, a first flexible layer 171 is provided between the first adhesive layer 161 and the first electrode 111, and a second flexible layer 172 is provided between the second adhesive layer 162 and the third electrode 113. The first flexible layer 171 and the second flexible layer 172 each may be made of a material of polyimide resin, and particularly, materials of the first flexible layer 171 and the second flexible layer 172 include transparent polyimide resin. It is verified that the thicker each of the first flexible layers 171 and the second flexible layer 172 is, the greater the sound pressure is, and thus the clearer the sound waves heard by the listener are. However, a relatively thick flexible layer may deteriorate light transmittance and increase a thickness of the sound generating panel. In some embodiments, the thickness of each of the first flexible layer 171 and the second flexible layer 172 is in a range from about 5 μm to about 50 μm.

In some embodiments, materials of the support layer 131 and the ultrasonic support layer 133 include polyethylene terephthalate.

In some embodiments, materials of the first encapsulation layer 141 and the second encapsulation layer 142 include polyimide resin. Particularly, the materials of the first encapsulation layer 141 and the second encapsulation layer 142 include transparent polyimide resin.

In some embodiments, materials of the first insulating layer 151, the second insulating layer 152, the third insulating layer 153, and the fourth insulating layer 154 include silicon nitride. Silicon nitride may prevent the piezoelectric material layer, before being cured, from contacting the electrode, and has a suitable dielectric constant, thereby avoiding a problem that the piezoelectric material layer is to be broken down due to an excessive voltage appearing in the sound generating panel in use, and improving the yield of the sound generating panel.

In some embodiments, materials of the first piezoelectric material layer 121, the second piezoelectric material layer 122, the third piezoelectric material layer 123, and the fourth piezoelectric material layer 124 include one or more of polyvinylidene fluoride (hereinafter referred to as PVDF), poly (vinylidene fluoride-co-trifluoroethylene) (hereinafter referred to as P(VDF-TrFE)). Particularly, the materials of the first piezoelectric material layer 121, the second piezoelectric material layer 122, the third piezoelectric material layer 123, and the fourth piezoelectric material layer 124 include poly (vinylidene fluoride-co-trifluoroethylene) (P(VDF-TrFE)).

Figure 12:
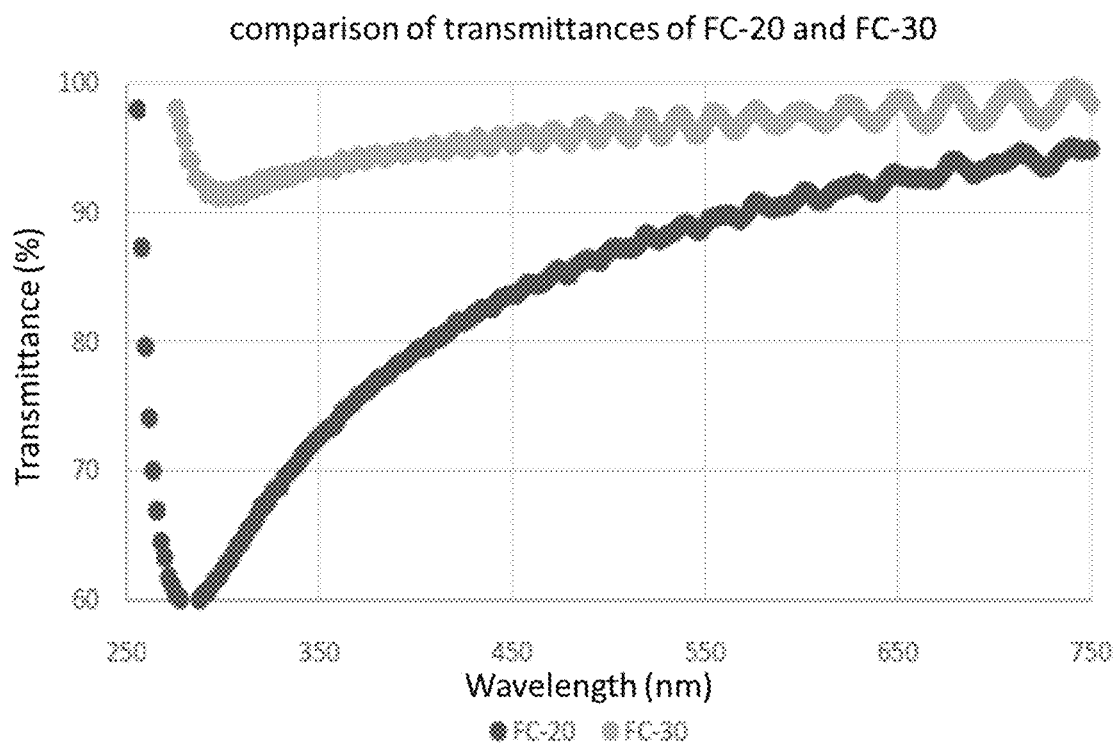
FIG. 12 is a scatter diagram illustrating a relationship between the transmittance and the wavelength of light in cases where piezoelectric material layers are made of different materials according to an embodiment of the present disclosure.

It is verified that PVDF has poor piezoelectric performance (i.e., an ability of converting an electrical signal to a vibration signal). The piezoelectric performance can be improved by using P(VDF-TrFE). Referring to FIG. 12, by comparing two materials of P(VDF-TrFE), it is found that a transmittance of FC-30 for visible light is significantly higher than that of FC-20 for visible light, where FC-20 represents that a mass fraction of trifluoroethylene monomer in copolymer of P(VDF-TrFE) is about 20 wt %; and FC-30 represents that a mass fraction of trifluoroethylene monomer in the copolymer of P(VDF-TrFE) is about 30 wt %. To improve the transmittance of the display panel, the materials of the first piezoelectric material layer 121, the second piezoelectric material layer 122, the third piezoelectric material layer 123, and the fourth piezoelectric material layer 124 each may be FC-30.

In some embodiments, materials of the first electrode 111, the second electrode 112, the third electrode 113, the fourth electrode 114, the receiving electrode 115, and the transmitting electrode 116 include a transparent electrode material. In particular, the transparent electrode material includes Indium Tin Oxide (ITO), graphene, silver nanowires, or the like.

Figure 13:
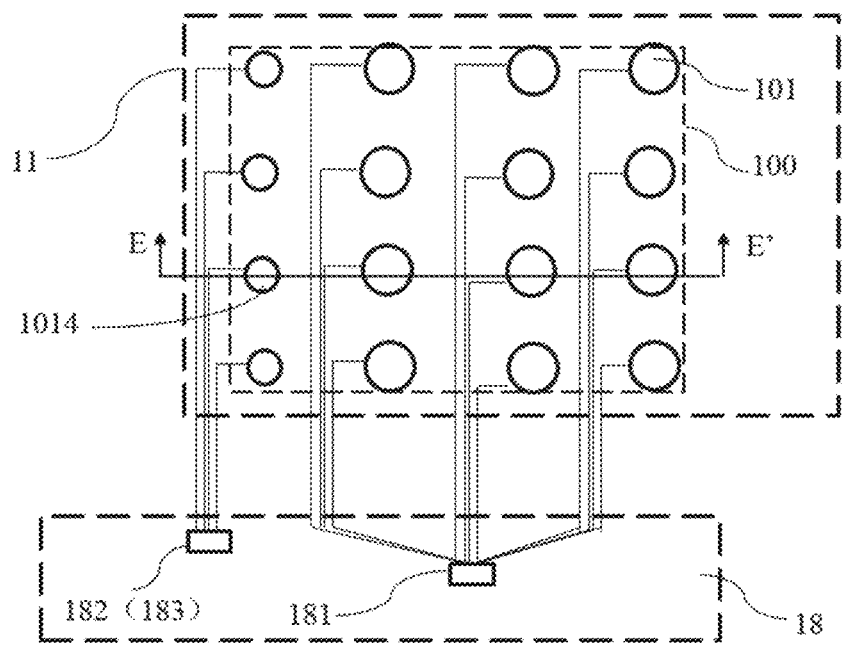
FIG. 13 is a schematic diagram of another sound generating panel according to an embodiment of the present disclosure.
Figure 14:
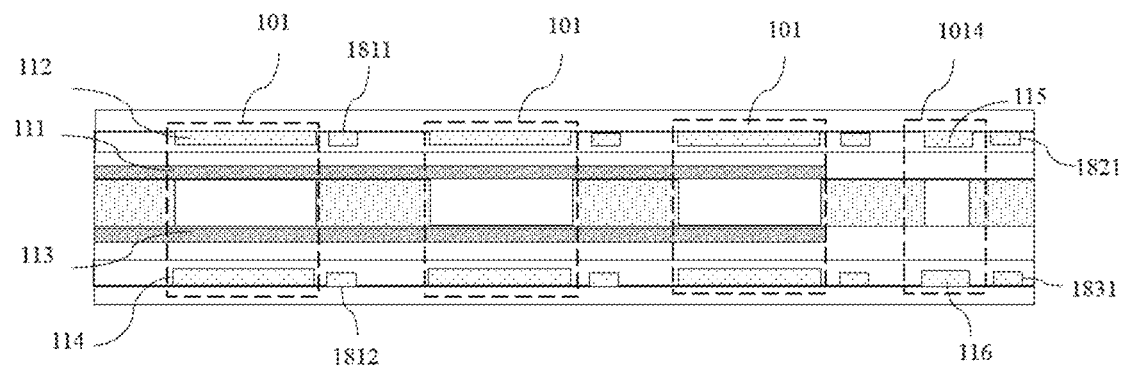
FIG. 14 is a cross-sectional view of another sound generating panel according to an embodiment of the present disclosure.

Referring to FIG. 13, in some embodiments, the sound generating panel includes a sound generating region 11 and a control chip region 18. The at least one sound generating unit group 100 is provided in the sound generating region 11, and sound generating units and ultrasonic detection units in each sound generating unit group are connected to chips in the control chip region 18 through a plurality of wires. Referring to FIG. 14, FIG. 14 is a cross-sectional view taken along a line E-E' of FIG. 13. In the embodiments, each sound generating unit group includes first wires 1811 disposed in the same layer as the second electrode 112, second wires 1812 disposed in the same layer as the fourth electrode 114, a receiving wire 1821 disposed in the same layer as the receiving electrode 115, and a transmitting wire 1831 disposed in the same layer as the transmitting electrode 116. The first wires 1811 and the second wires 1812 are electrically connected to a sound generating unit chip 181, the receiving wire 1821 is electrically connected to a receiving chip 182, and the transmitting wire 1831 is electrically connected to a transmitting chip 183. It should be understood by one of ordinary skill in the art that, in a top view of the sound generating panel 10, orthographic projections of the receiving chip 182 and the transmitting chip 183 may coincide with each other or may not coincide with each other. As shown in FIG. 13, the orthographic projections of the receiving chip 182 and the transmitting chip 183 coincide with each other.

Figure 15:
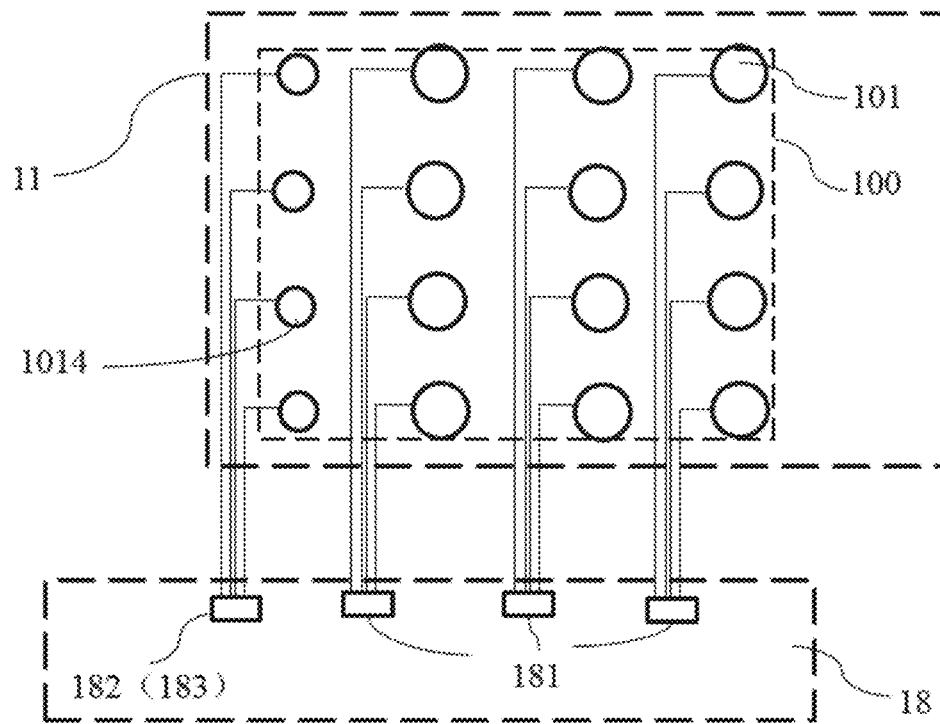
FIG. 15 is a schematic diagram of another sound generating panel according to an embodiment of the present disclosure.

In some embodiments, each column of sound generating units in each sound generating unit group 100 may be connected to a same pin in the control chip region 18, i.e., the columns of sound generating units in each sound generating unit group 100 may be connected to the pins in the control chip region 18 respectively. Reference may be made in particular to FIG. 15.

Figure 16:
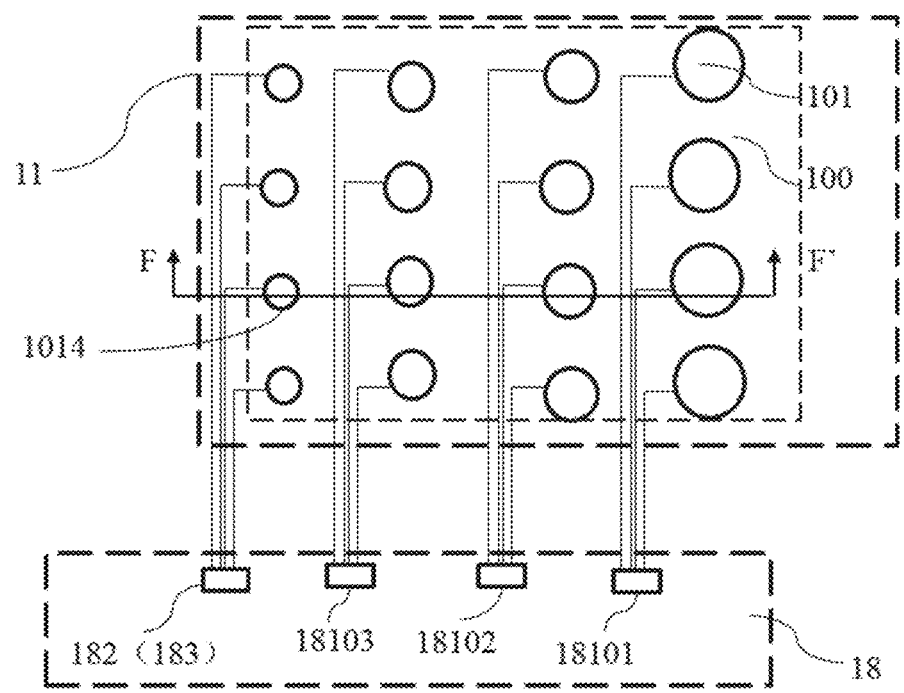
FIG. 16 is a schematic diagram of another sound generating panel according to an embodiment of the present disclosure.
Figure 17:
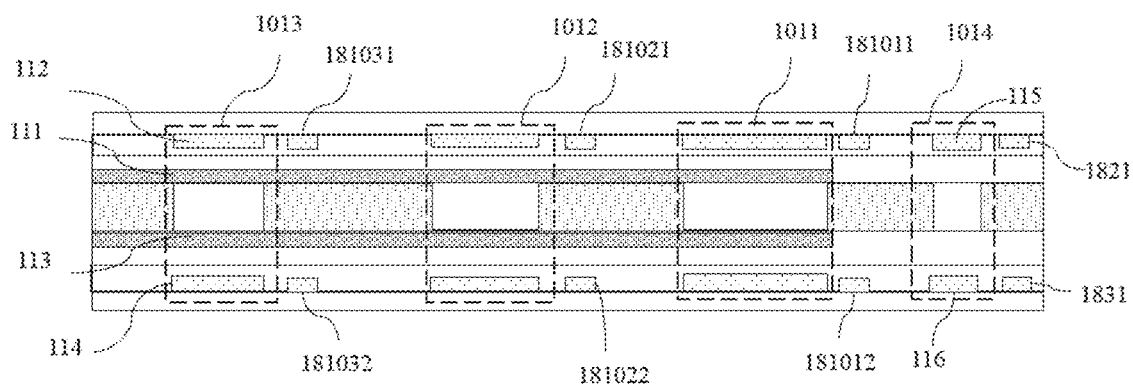
FIG. 17 is a cross-sectional view of another sound generating panel according to an embodiment of the present disclosure.

Referring to FIGS. 16 and 17, FIG. 17 is a cross-sectional view along a line F-F' of FIG. 16, in some embodiments, a first sound generating unit chip 18101, a second sound generating unit chip 18102, and a third sound generating unit chip 18103 are provided in the control chip region 18. Referring to FIG. 17, first sound generating unit wires 181011 and 181012 are electrically connected to the first sound generating unit chip 18101, second sound generating unit wires 181021 and 181022 are electrically connected to the second sound generating unit chip 18102, and third sound generating unit wires 181031 and 181032 are electrically connected to the third sound generating unit chip 18103. Referring to FIGS. 16 and 17, a radius of each first sound generating unit 1011 controlled by the first sound generating unit chip 18101 is the greatest, a radius of each third sound generating unit 1013 controlled by the third sound generating unit chip 18103 is the smallest, and a radius of each second sound generating unit 1012 controlled by the second sound generating unit chip 18102 is greater than the radius of each third sound generating unit 1013 and smaller than the radius of each first sound generating unit 1011.

Figure 18:
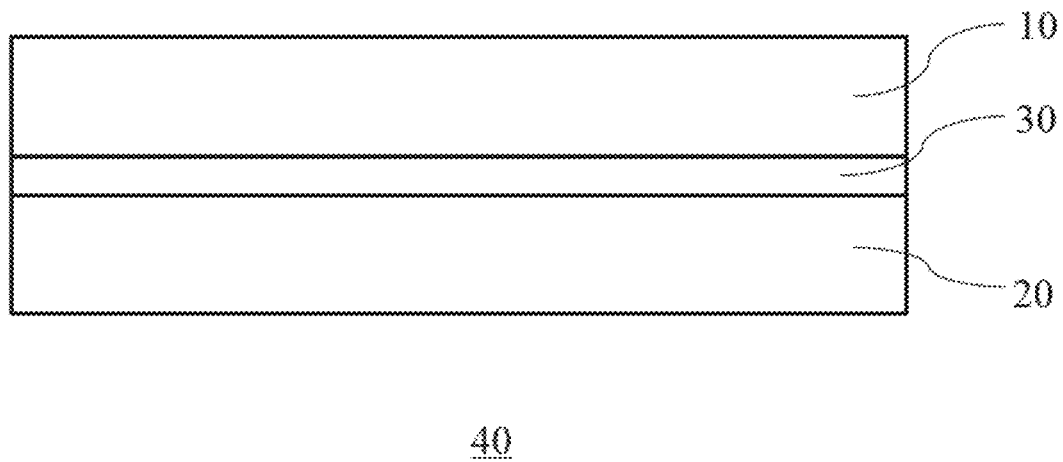
FIG. 18 is a schematic diagram of a display device with a screen generating sound according to an embodiment of the present disclosure.

At least one embodiment of the present disclosure further provides a display device with a screen generating sound. Referring to FIG. 18, the display device 40 includes a sound generating panel 10, a display panel 20, and a connection layer 30 connecting the sound generating panel 10 and the display panel 20. The display panel 20 may be a thin film transistor liquid crystal display panel (TFT-LCD), a mini LED or a micro LED display panel, or an organic light emitting diode (OLED) display panel. A material of the connection layer 30 includes optically clear adhesive (OCA) or optically clear resin (OCR). The sound generating panel 10 may be adhered to the display panel 20 through the connection layer 30. In some embodiments, the connection layer 30 is coated, as a whole, between the sound generating panel 10 and the display panel 20. In such way, connection areas between the connection layer and the sound generating panel 10 and between the connection layer and the display panel 20 are increased, and the strength of connection between the sound generating panel 10 and the display panel 20 is enhanced. In the embodiments, a thickness of the display device is not greatly increased while ensuring the integration of the display device, which meets the expectation of customers on ultrathin display devices.

Figure 19:
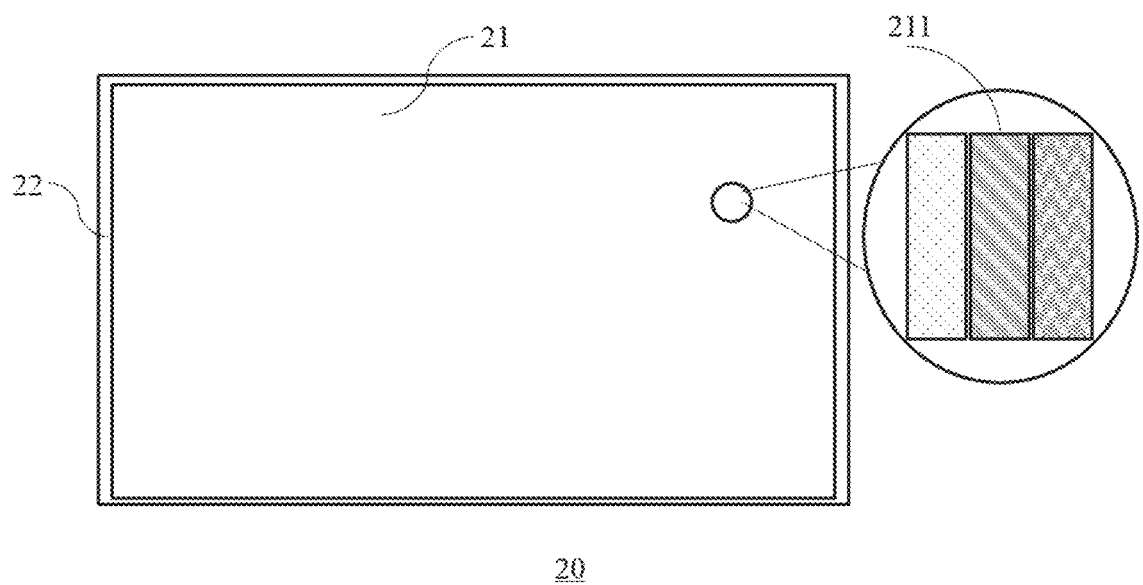
FIG. 19 is a schematic diagram of a display panel of a display device with a screen generating sound according to an embodiment of the present disclosure.

Referring to FIG. 19, in some embodiments, the display device includes a display region 21 and a peripheral region 22. Pixel units 211 arranged in an array are provided in the display region, and an orthographic projection of each sound generating unit group 100 of the sound generating panel 10 on the display panel 20 covers at least one pixel unit.

Figure 20:
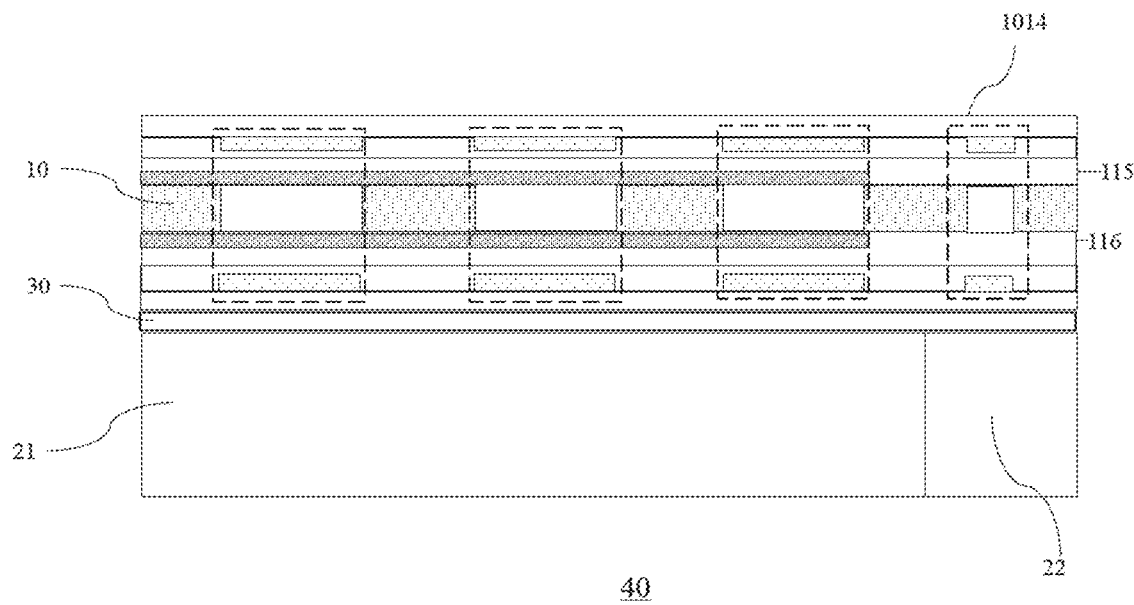
FIG. 20 is a schematic diagram of another display device with a screen generating sound according to an embodiment of the present disclosure.

Referring to FIG. 20, since each film layer of the sound generating panel 10 is made of a material having a relatively high transmittance for light, the transmittance, for visible light, of the sound generating panel is entirely above 90%. Therefore, the sound generating panel 10 may be directly adhered to a light outgoing side of the display panel 20. In particular, the receiving electrode 115 is farther away from the light outgoing side of the display panel 20 than the transmitting electrode 116, which may reduce loss of the ultrasonic signal received by the receiving electrode 115.

With continued reference to FIG. 20, in some embodiments, an orthographic projection of each ultrasonic detection unit 1014 on the display device may be located in the peripheral region 22 or the display region 21 of the display device 20, and may overlap an orthographic projection of at least one pixel unit 211 on the display device, which is not limited in the embodiments.

At least one embodiment of the present disclosure further provides a method for manufacturing a sound generating panel. In some embodiments, the piezoelectric structure and the support layer are formed, respectively, and the sound generating panel is formed by adhering layers together. In such way, the process may be simplified and the manufacturing cost may be reduced.

FIG. 21A to 21F show a method for manufacturing the first piezoelectric structure 1021, and a method for manufacturing the second piezoelectric structure 1022 is the same as the method for manufacturing the first piezoelectric structure 1021.

Figure 21A:
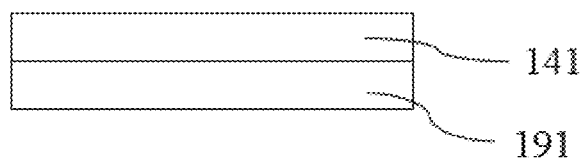
FIGS. 21A to 21F are schematic diagrams illustrating steps of a method for fabricating a piezoelectric structure according to an embodiment of the present disclosure.
Figure 21B:
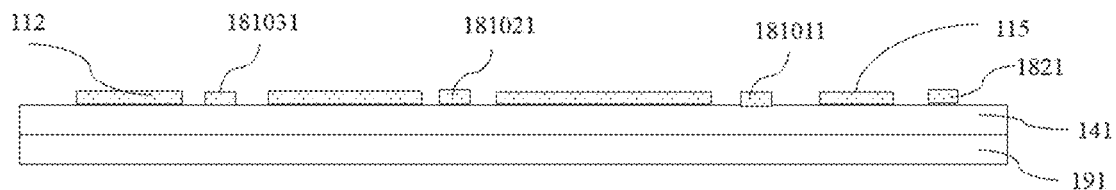

Referring to FIG. 21A, a glass substrate 191 is provided, and a first encapsulation layer 141 is formed on the glass substrate. As shown in FIG. 21B, an electrode layer is formed on a side of the first encapsulation layer 141 away from the glass substrate 191, and the electrode layer is patterned by photolithography, etching, or the like, to form a plurality of second electrodes 112 and a receiving electrode 115. All, or not all, of the second electrodes 112 may have a consistent or same radius. The second electrode 112 and the receiving electrode 115 may be made of a transparent electrode material, and particularly, may be made of indium tin oxide (ITO). A plurality of wires 181031, 181021, 181011 and 1821 electrically connected to the second electrodes 112 are formed, to be connected to a pin of a same sound generating unit, or connected to pins of different sound generating units, which is not limited thereto.

Figure 21C:
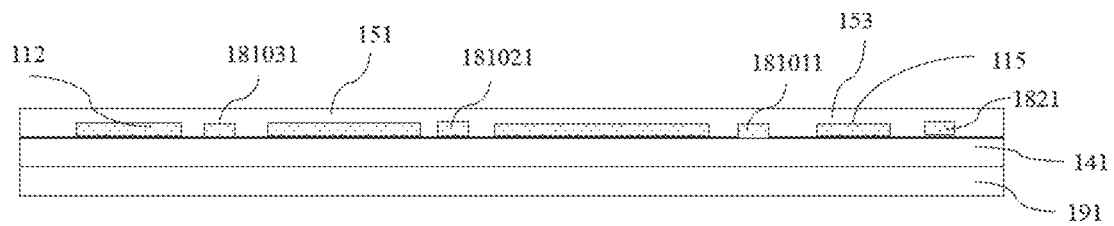

As shown in FIG. 21C, a first insulating layer 151 and a third insulating layer 153 are formed on a layer where the electrodes are located, and are formed in a same layer and made of a same material. In particular, materials of the first insulating layer 151 and the third insulating layer 153 may include silicon nitride, which has excellent light transmitting properties, and on the one hand, can prevent the piezoelectric material layer, before being cured, from contacting the electrode to affect properties of the electrode; on the other hand, voltage breakdown can be avoided, and the yield is improved.

Figure 21D:
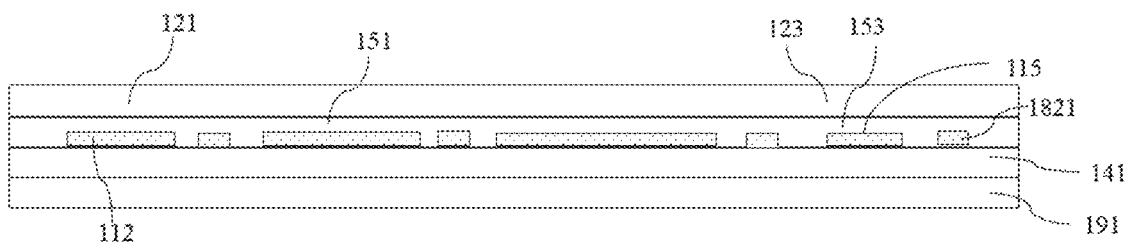

As shown in FIG. 21D, a layer of organic piezoelectric material having a thickness in a range from about 40 μm to about 50 μm is coated on the first insulating layer 151 and the third insulating layer 153, and particularly, the organic piezoelectric material may be P(VDF-TrFE), where the mass fraction of the trifluoroethylene monomer in the copolymer of P(VDF-TrFE) is about 30 wt %. Then, the organic piezoelectric material is cured, and a crystallization treatment is performed on the cured organic piezoelectric material to achieve a conversion of a crystal form, so as to form a first piezoelectric material layer 121 and a third piezoelectric material layer 123 arranged in a same layer and made of a same material.

Figure 21E:
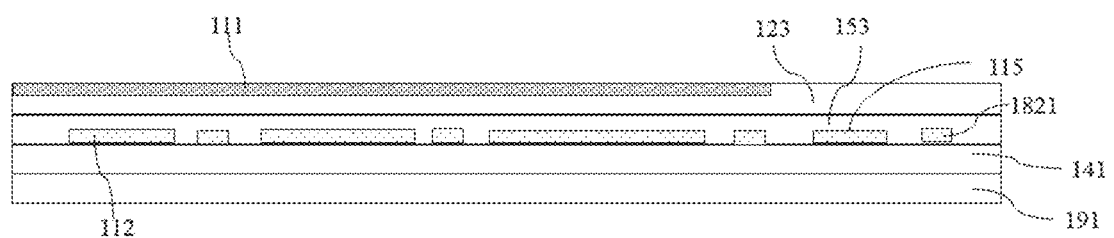

As shown in FIG. 21E, a first electrode 111 is formed on the first piezoelectric material layer 121, and the first electrode may be patterned or may be an electrode in an entire layer. The thickness (about 0.08 μm in the embodiments) of each of the first electrode 111 and the third electrode 113 is much smaller than that (about 9 μm in the embodiments) of each of the first piezoelectric material layer 121 and the second piezoelectric material layer 122, and FIG. 21E is intent to show the first electrode 111, in an actual product and a process for manufacturing the actual product, the thickness of the first electrode 111 is negligible relative to the thickness of the first piezoelectric material layer 121. Then, the piezoelectric structure is attached to the support layer. In the embodiments, the first electrode 111 is formed as the entire layer on the first piezoelectric material layer 121, so that the process difficulty and the cost can be reduced.

Figure 21F:
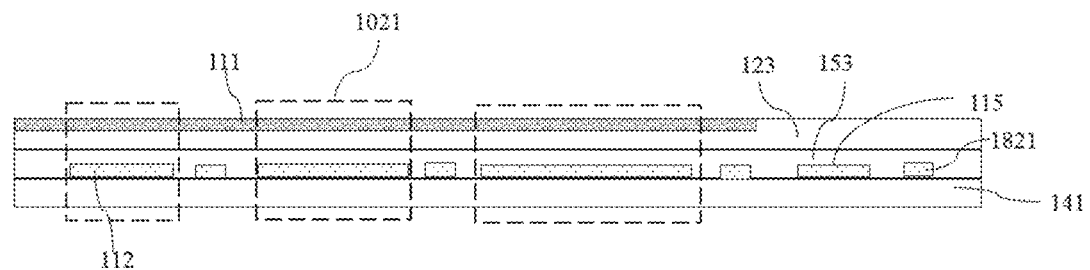

As shown in FIG. 21F, the glass substrate 119 is peeled off by using a laser lift-off (LLO) technique, and thus a first encapsulation layer 141 and a plurality of first piezoelectric structures 1021 and a portion of ultrasonic detection units on the first encapsulation layer 141 are obtained.

Figure 22A:
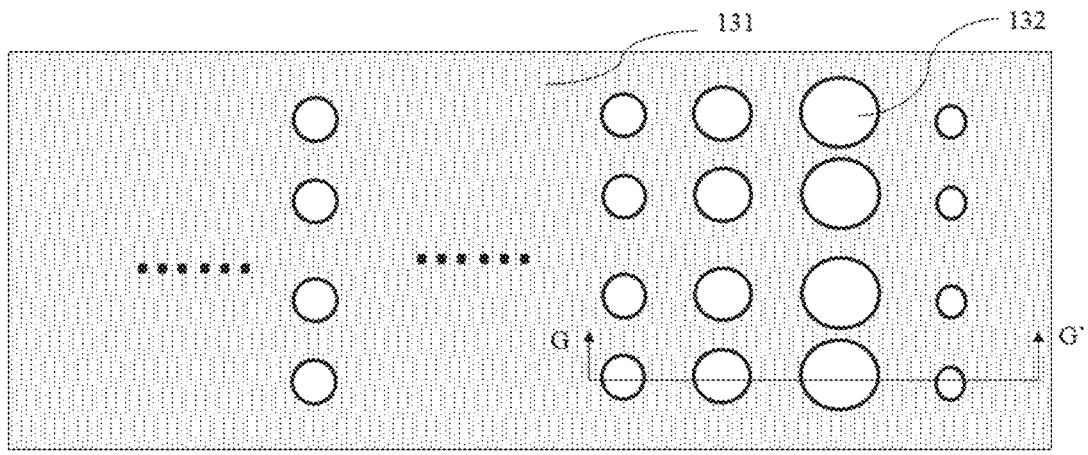
FIGS. 22A to 22B are schematic diagrams illustrating a method for fabricating a support layer according to an embodiment of the present disclosure.
Figure 22B:
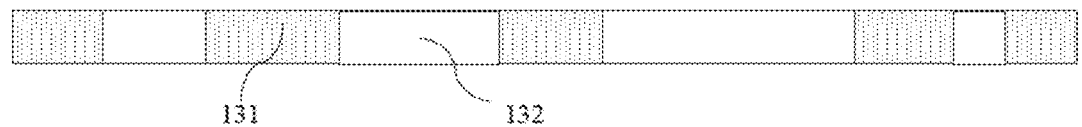

FIGS. 22A to 22B illustrate a method of fabricating a support layer 131. Referring to FIG. 22A, the support layer 131 is provided, a plurality of openings 132 are formed in the support layer 131 by laser drilling, and a shape of each of the openings 132 may be circular, square, regular polygon, etc., which is not limited in the embodiments. The shape of each of the openings 132 is the same as a shape of the second electrode 112 or the receiving electrode 115, and a radius of each of the openings 132 is the same as a radius of the second electrode 112 or the receiving electrode 115. FIG. 22B is a cross-sectional view taken along a line G-G' of FIG. 22A.

Figure 23:
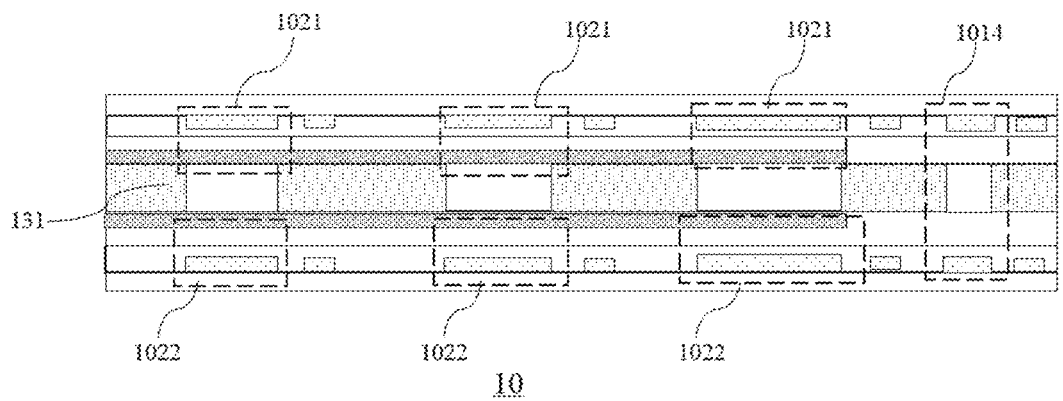
FIG. 23 is a schematic diagram illustrating a method for manufacturing a sound generating panel according to an embodiment of the present disclosure.

As shown in FIG. 23, the sound generating panel 10 is formed by respectively adhering the first piezoelectric structure 1021 and the second piezoelectric structure 1022 to two sides of the support layer 131.

Other embodiments of the present disclosure will be apparent to one of ordinary skill in the art from considering the specification and practices of the present disclosure. The present application is intended to cover any variations, uses, or adaptations of the present disclosure, these variations, uses, or adaptations follow general principles of the present disclosure and include the common general knowledge or conventional technical means in the technical field. It is intended that the specification and embodiments are considered as exemplary only, a true scope and spirit of the present disclosure are defined by claims.

What is claimed is:

1. A sound generating panel, comprising at least one sound generator unit group,
wherein each of the at least one sound generator group comprises at least one sound generator, each of the at least one sound generator comprises a support layer, a first piezoelectric structure and a second piezoelectric structure; the first piezoelectric structure and the second piezoelectric structure are on opposite sides of the support layer, respectively;
the support layer comprises openings, and orthographic projections of the first piezoelectric structure and the second piezoelectric structure on a plane where the support layer is located partially overlaps an orthographic projection of the opening, corresponding to the first piezoelectric structure and the second piezoelectric structure, on the plane;
the first piezoelectric structure comprises a first electrode on the support layer, a first piezoelectric material layer on a side of the first electrode away from the support layer, and a second electrode on a side of the first piezoelectric material layer away from the first electrode; and
the second piezoelectric structure comprises a third electrode on a side of the support layer away from the first piezoelectric structure, a second piezoelectric material layer on a side of the third electrode away from the support layer and a fourth electrode on a side of the second piezoelectric material layer away from the third electrode,
the sound generating panel further comprises an encapsulation layer comprising a first encapsulation layer on a side of the second electrode away from the first piezoelectric material layer and a second encapsulation layer on a side of the fourth electrode away from the second piezoelectric material layer,
wherein an orthographic projection of each first sound generator on the encapsulation layer is greater than an orthographic projection of each second sound generator on the encapsulation layer, and the orthographic projection of each second sound generator on the encapsulation layer is greater than an orthographic projection of each third sound generator on the encapsulation layer.

2. The sound generating panel according to claim 1, wherein the orthographic projection of the first piezoelectric structure on the plane where the support layer is located overlaps the orthographic projection of the opening, corresponding to the first piezoelectric structure, on the plane,
and/or the orthographic projection of the second piezoelectric structure on the plane where the support layer is located overlaps the orthographic projection of the opening, corresponding to the second piezoelectric structure, on the plane.

3. The sound generating panel according to claim 2, further comprising a first insulating layer between the second electrode and the first piezoelectric material layer, and a second insulating layer between the fourth electrode and the second piezoelectric material layer.

4. The sound generating panel according to claim 3, wherein each of the at least one sound generator is configured to emit sound waves having a frequency in a range from about 20 Hz to about 20000 Hz.

5. The sound generating panel according to claim 4, wherein each of the at least one sound generator unit group comprises at least one first sound generator and at least one second sound generator, the at least one first sound generator is configured to emit sound waves having a first frequency; and the at least one second sound generator is configured to emit sound waves having a second frequency; the first frequency and the second frequency are in different frequency ranges respectively.

6. The sound generating panel according to claim 5, wherein each of the at least one sound generator group comprises a plurality of first sound generators arranged along a first direction and a plurality of second sound generators arranged along the first direction, and each first sound generator is adjacent to the second sound generator, corresponding to said each first sound generator, in a second direction; the first direction and the second direction intersect with each other.

7. The sound generating panel according to claim 5, wherein each of the at least one sound generator group further comprises at least one third sound generator configured to emit sound waves having a third frequency, and the first frequency is in a range from 20 Hz to 500 Hz, the second frequency is in a range from 500 Hz to 2000 Hz, and the third frequency is in a range from 2000 Hz to 20000 Hz.

8. The sound generating panel according to claim 1, wherein the at least one sound generator group comprises at least one ultrasonic detector configured to transmit and receive sound waves having a frequency of above 20000 Hz; each of the at least one ultrasonic detector comprises a receiving electrode in the same layer as the second electrode, a transmitting electrode in the same layer as the fourth electrode, a third piezoelectric material layer in the same layer and made of the same material as the first piezoelectric material layer, a fourth piezoelectric material layer in the same layer and made of the same material as the second piezoelectric material layer, and an ultrasonic support layer in the same layer as the support layer.

9. The sound generating panel according to claim 8, further comprising a third insulating layer between the third piezoelectric material layer and the receiving electrode, and a fourth insulating layer between the fourth piezoelectric material layer and the transmitting electrode.

10. The sound generating panel according to claim 9, wherein an orthographic projection of each ultrasonic detector on the plane where the support layer is located is smaller than an orthographic projection of each sound generator on the encapsulation layer.

11. The sound generating panel according to claim 1, further comprising a first adhesive layer between the support layer and the first electrode, and a second adhesive layer between the support layer and the third electrode, wherein each of the first adhesive layer and the second adhesive layer is made of an optically clear adhesive.

12. The sound generating panel according to claim 11, further comprising a first flexible layer between the first adhesive layer and the first electrode, and a second flexible layer between the second adhesive layer and the third electrode, wherein each of the first flexible layer and the second flexible layer is made of a polyimide resin.

13. A display device with a screen generating sound, comprising a display panel and the sound generating panel according to claim 1.

14. The display device according to claim 13, wherein the display panel comprises a display region and a peripheral region, a plurality of pixel arranged in an array are provided in the display region; an orthographic projection of each sound generator group on the display panel covers at least one pixel.

15. The display device according to claim 14, wherein an orthographic projection of each ultrasonic detector on the display panel partially overlaps the peripheral region.

16. The display device according to claim 14, wherein an orthographic projection of each ultrasonic detector on the display panel covers at least one pixel.

17. A sound generating panel, comprising at least one sound generator group,
wherein each of the at least one sound generator group comprises at least one sound generator, each of the at least one sound generator comprises a support layer, a first piezoelectric structure and a second piezoelectric structure; the first piezoelectric structure and the second piezoelectric structure are on opposite sides of the support layer, respectively;
the support layer comprises openings, and orthographic projections of the first piezoelectric structure and the second piezoelectric structure on a plane where the support layer is located partially overlaps an orthographic projection of the opening, corresponding to the first piezoelectric structure and the second piezoelectric structure, on the plane;
the first piezoelectric structure comprises a first electrode on the support layer, a first piezoelectric material layer on a side of the first electrode away from the support layer, and a second electrode on a side of the first piezoelectric material layer away from the first electrode; and
the second piezoelectric structure comprises a third electrode on a side of the support layer away from the first piezoelectric structure, a second piezoelectric material layer on a side of the third electrode away from the support layer and a fourth electrode on a side of the second piezoelectric material layer away from the third electrode,
the sound generating panel further comprises a first adhesive layer between the support layer and the first electrode, a second adhesive layer between the support layer and the third electrode, a first flexible layer between the first adhesive layer and the first electrode, and a second flexible layer between the second adhesive layer and the third electrode, wherein each of the first adhesive layer and the second adhesive layer is made of an optically clear adhesive, and each of the first flexible layer and the second flexible layer is made of a polyimide resin.

\* \* \* \* \*